(12) United States Patent
Nedved

(10) Patent No.: US 11,991,407 B2
(45) Date of Patent: May 21, 2024

(54) MAGNETIC CONNECTOR ATTACHMENT AND HEAT SINKING

(71) Applicant: DISH Network L.L.C., Englewood, CO (US)

(72) Inventor: Steven Nedved, Littleton, CO (US)

(73) Assignee: DISH Network L.L.C., Englewood, CO (US)

( * ) Notice: Subject to any disclaimer, the term of this patent is extended or adjusted under 35 U.S.C. 154(b) by 534 days.

(21) Appl. No.: 16/891,516

(22) Filed: Jun. 3, 2020

(65) Prior Publication Data

US 2020/0382825 A1 Dec. 3, 2020

Related U.S. Application Data

(60) Provisional application No. 62/856,626, filed on Jun. 3, 2019.

(51) Int. Cl.
*H04N 21/426* (2011.01)
*H05K 7/14* (2006.01)
*H05K 7/20* (2006.01)

(52) U.S. Cl.
CPC ......... *H04N 21/426* (2013.01); *H05K 7/1401* (2013.01); *H05K 7/20509* (2013.01)

(58) Field of Classification Search
CPC . H04N 21/426; H04K 7/1401; H04K 7/20509
USPC ....................................................... 725/151
See application file for complete search history.

(56) References Cited

U.S. PATENT DOCUMENTS

| | | | | |
|---|---|---|---|---|
| 4,300,341 | A * | 11/1981 | Pozzo | D01H 13/16 57/80 |
| 10,725,722 | B1 * | 7/2020 | Koelmel | G06F 3/1446 |
| 11,231,757 | B2 * | 1/2022 | Kurma Raju | H04M 1/022 |
| 2012/0033384 | A1 * | 2/2012 | Pillai | H05K 7/20445 165/185 |
| 2018/0239404 | A1 * | 8/2018 | Siddiqui | G06F 1/206 |
| 2020/0367383 | A1 * | 11/2020 | Moon | G06F 1/203 |

* cited by examiner

*Primary Examiner* — Dominic D Saltarelli
(74) *Attorney, Agent, or Firm* — Perkins Coie LLP

(57) ABSTRACT

A co-processor module for use with a set top box including an enclosure and a processor assembly contained in the enclosure. The processor assembly can include a PCB, a processor, and a USB connector. One or more magnets extend through a wall of the enclosure and are positioned to contact a surface of the set top box when the USB connector is connected to the set top box.

15 Claims, 5 Drawing Sheets

MAGNETIC CONNECTOR ATTACHMENT AND HEAT SINKING

CROSS-REFERENCE TO RELATED APPLICATION

This application claims the benefit of and priority to U.S. Provisional Patent Application No. 62/856,626, filed Jun. 3, 2019, the disclosure of which is incorporated herein by reference in its entirety.

TECHNICAL FIELD

This patent application is directed to electrical connections, and more specifically, to USB based accessory connections.

BACKGROUND

A USB based accessory inserted into a piece of electrical equipment is held in place by the low friction forces between the mating components of the interface connection (e.g., a thumb drive inserted into a computer via the USB port). Occasionally the electrical connection is interrupted due to the dis-engaging of the connection caused by vibration, un-intended contact, and the like.

BRIEF DESCRIPTION OF THE DRAWINGS

The devices, systems, and methods described herein may be better understood by referring to the following Detailed Description in conjunction with the accompanying drawings, in which like reference numerals indicate identical or functionally similar elements.

Figure 1:
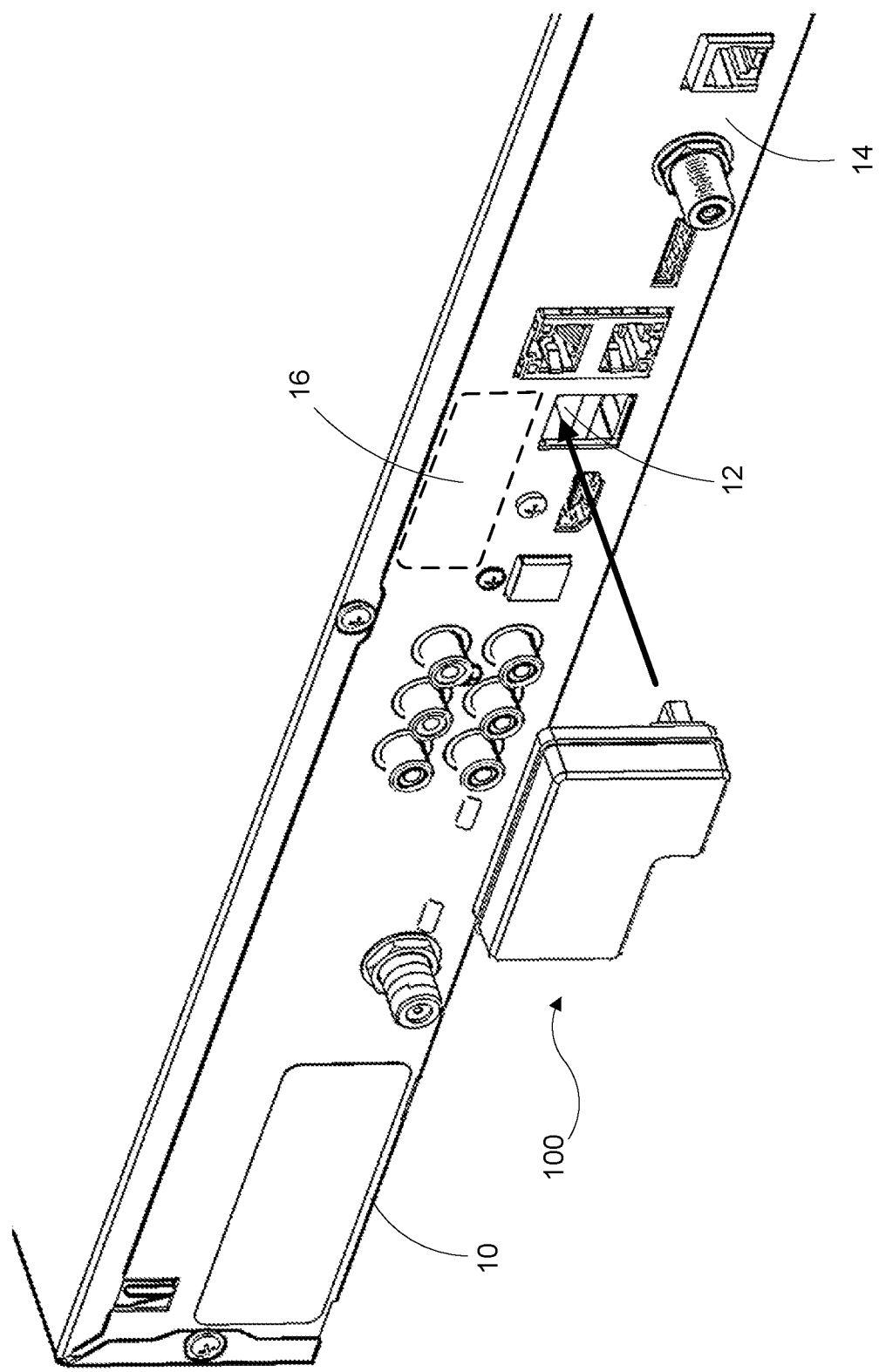
FIG. 1 is an isometric view illustrating the insertion of a co-processor module into a device, such as a set top box.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all modifications, combinations, equivalents, and alternatives falling within the scope of this disclosure.

DETAILED DESCRIPTION

Various examples of the systems and methods introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 2:
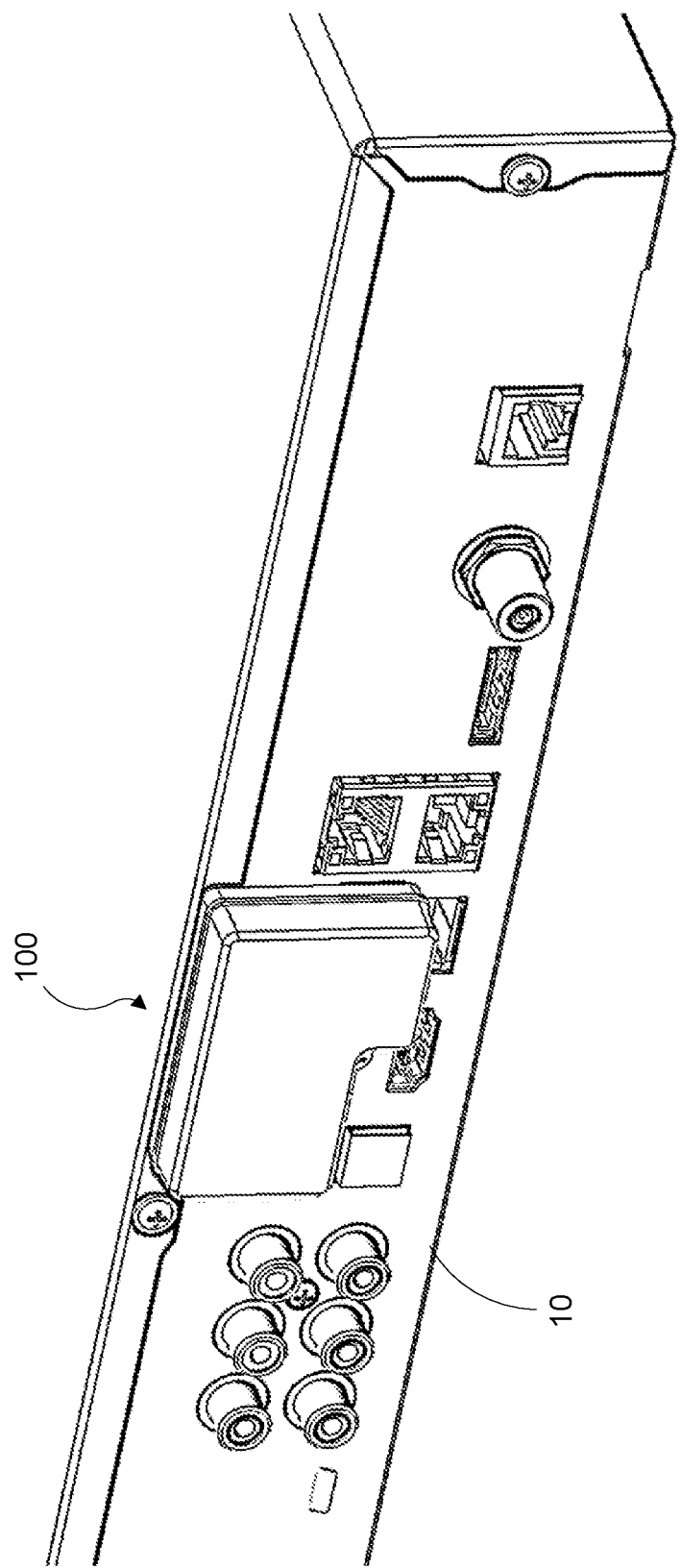
FIG. 2 is an isometric view illustrating the co-processor module secured to the device.

As shown in FIGS. 1 and 2, the co-processor module 100 can be inserted into a USB receptacle 12 of a device, such as a set top box 10 (e.g., receiver). Although described in the context of a co-processor module for a set top box, the disclosed technology can be applied in other applications, such as but not limited to other USB devices (e.g., memory device). Furthermore, the disclosed technology can be applied with other types of connectors.

Figures 3A, 3B:
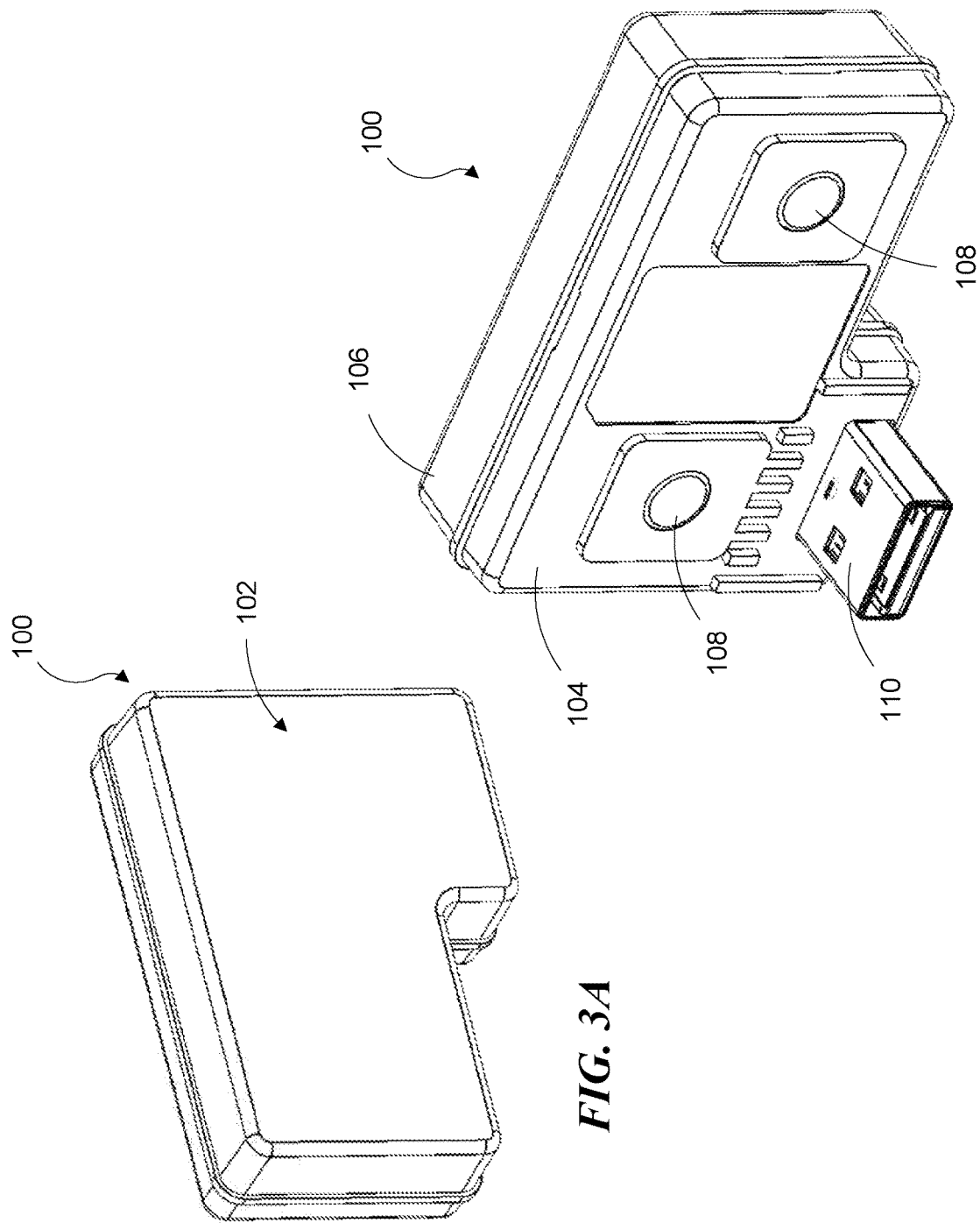
FIGS. 3A and 3B are isometric views illustrating the front and back of the module shown in FIGS. 1 and 2.

As shown in FIGS. 3A and 3B, the co-processor module 100 can include an enclosure 102 having first and second mating enclosure halves 104 and 106, respectively. In some embodiments, the enclosure halves are comprised of molded plastic. In the depicted embodiment, the first (e.g., top) enclosure half 104 houses a pair of magnets 108 that magnetically attach to an open area 16 on the device housing 14 (FIG. 1) to help secure the co-processor module 100 to the device 10. In some embodiments, the enclosure halves can snap together.

The disclosed technology uses a male type A USB connector 110 extending from the first half 104 and connects into the mating USB connection 12 (FIG. 1) on the back of the device 10 (e.g., set top box). In addition to the low friction force holding power of the USB connection, this module utilizes the two small magnets 108 to significantly enhance the holding power of the connection. Significant advantage of a USB connection for any product is the quick insertion and removal of the connection from the mating device. The usage of the magnets 108 still provides that same ease of insertion and removal without the need for any tool or extra effort; but offers the added benefit of a more robust secure connection. This arrangement allows the module 100 to be shipped from the warehouse already installed onto the device 10.

In addition, the two magnets 108 act as a medium or conduction path to transfer heat from the module's PCB processor chip to the back panel surface of the device 10, thus aiding in the heat mitigation of the fully enclosed co-processor system. One of the issues that is very common on set top units is any accessories or connection that are plugged into the back of the receiver have a tendency to become unplugged or disconnected due to the customer moving the set top box around in the television cabinet or similar mounting vicinity. This technology significantly reduces or eliminates this from happening.

Figure 4:
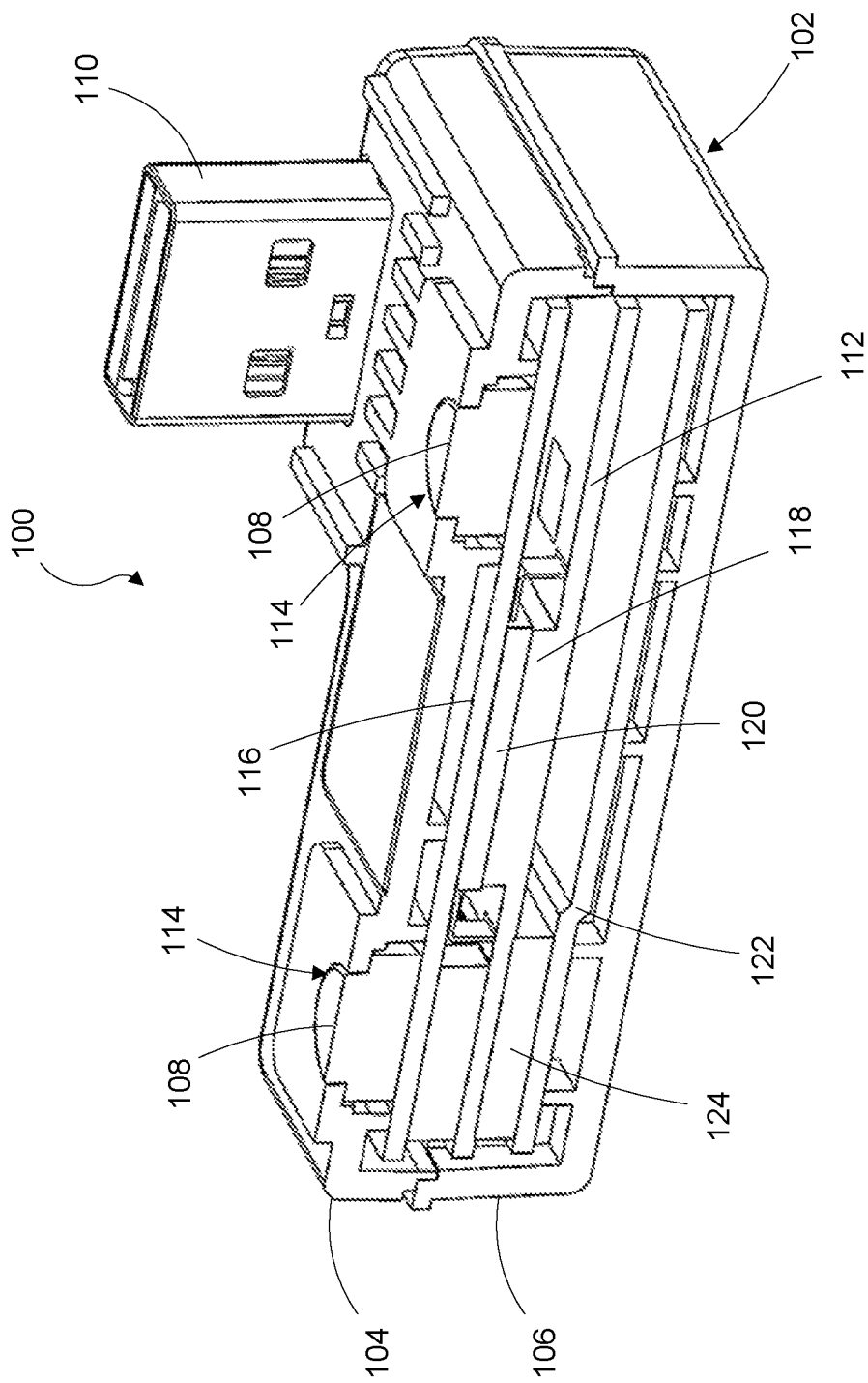
FIG. 4 is an isometric cross-sectional view of the module illustrating the internal components of the module.
Figure 5:
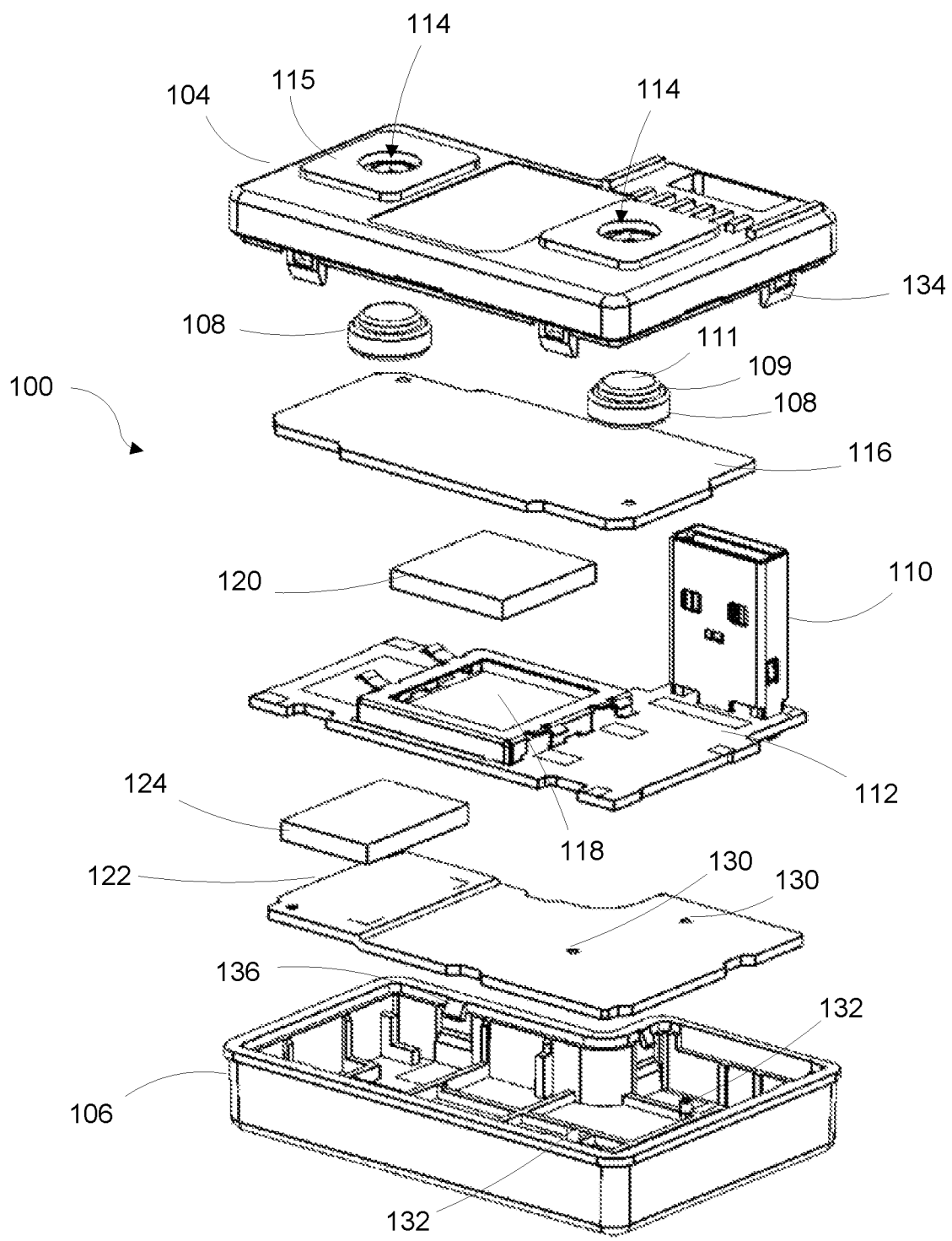
FIG. 5 is an exploded isometric view of the module.

With reference to FIGS. 4 and 5, the module 100 can include a PCB assembly 112 that is captured between the two custom plastic halves 104 and 106. The first half 104 has the two magnets 108 each inserted into a corresponding aperture 114 formed in the first half (e.g., top half) and captured therein by heat staking a first aluminum plate 116 to the top half. In some embodiments, each magnet 108 can have a shoulder 109 to facilitate capturing the magnet in the housing. The processing chip 118 of the PCB assembly 112 makes contact with the aluminum plate 116, via a thermal pad 120, and the aluminum plate 116 makes direct contact with the two steel magnets (e.g., NdFeB) 108, thus allowing the path for heat transfer away from the processing chip 118. The opposite outward facing surface 111 of the magnet is exposed outside the module's enclosure, thus having the ability to make contact with the sheet metal surface (e.g., open area 16) of the device's chassis when the USB 110 is properly engaged into the device. In some embodiments, the first half 104 can include a planar region 115 surrounding each magnet 108 and approximately co-planar with the outward facing surface 111 of the magnets. In some embodiments, the planar regions 115 and surfaces 111 can be offset from the first half 104 as shown in the figures.

In some embodiments, a second aluminum plate 122 can be positioned in the enclosure on the opposite side of the PCB assembly 112 to help dissipate heat from the PCB via a second thermal pad 124. As shown in FIG. 5, the second aluminum plate 122 can include multiple mounting holes 130 that mate with corresponding pins 132 formed in the second half 106. Once the plate 122 is positioned on the pins 132, the pins can be melted or otherwise deformed, thereby staking the plate 122 in place. The first aluminum plate 116 can be attached to the first half 104 in a similar manner. In some embodiments, the first half 104 can include multiple clips 134 positioned to engage mating barbs 136 formed in the second half 106 in order to facilitate assembly by snapping the two halves together and capturing the components within.

In an embodiment according to the disclosed technology a co-processor module for use with a set top box comprises an enclosure; a processor assembly contained in the enclosure and including a PCB, a processor, and a USB connector; and one or more magnets extending through a wall of the enclosure and positioned to contact a surface of the set top box when the USB connector is connected to the set top box. In some embodiments, the module further comprises a metal plate positioned between the processor and the one or more magnets and a thermal pad positioned between the processor and the metal plate. In some embodiments, the metal plate is a first metal plate and the thermal pad is a first thermal pad, and further comprising a second thermal pad positioned against the PCB and a second metal plate positioned against the second thermal pad. In some embodiments, the enclosure comprises a first half and a second half, and wherein the one or more magnets and the USB connector extend through the first half of the enclosure. In some embodiments, the first half includes a planar region surrounding each of the one or more magnets and offset from the first half, each planar region being approximately co-planar with an outward facing surface of the corresponding magnet. In some embodiments, the module further comprises a metal plate attached to the first half, wherein the one or more magnets are captured therebetween.

In an embodiment according to the disclosed technology a co-processor module for use with a device comprises an enclosure having a first half and a second half; a processor assembly contained in the enclosure and including a PCB, a processor, and a connector extending through the first half; one or more magnets extending through the first half and positioned to contact a surface of the device when the connector is connected to the device; a metal plate attached to the first half, wherein the one or more magnets are in contact with and captured between the first half and the metal plate; and a thermal pad in contact with and positioned between the processor and the metal plate. In some embodiments, the metal plate is a first metal plate and the thermal pad is a first thermal pad, and further comprising a second thermal pad positioned against the PCB and a second metal plate positioned against the second thermal pad. In some embodiments, the second metal plate is attached to the second half. In some embodiments, the first and second halves include mating features configured for snap together engagement with each other. In some embodiments, the first half includes a planar region surrounding each of the one or more magnets and offset from the first half, each planar region being approximately co-planar with an outward facing surface of the corresponding magnet. In some embodiments, the connector is a USB connector.

In an embodiment according to the disclosed technology a method for supplementing the processing capability of an electronic device comprises connecting a module containing a processing device to the electronic device via a connector; retaining the module against a surface of the electronic device with one or more magnets; and transferring heat from the processing device to the surface of the electronic device via the one or more magnets. In some embodiments, the processing device if one of a processor or a memory device. In some embodiments, the electronic device is a set top box. In some embodiments, the connector is a USB connector. In some embodiments, the method further comprises positioning a metal plate between the one or more magnets and the processing device.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A co-processor module for use with a set top box, the module comprising:
   an enclosure;
   a processor assembly contained in the enclosure and including a PCB, a processor, and a USB connector;
   one or more magnets extending through a wall of the enclosure and positioned to directly contact a surface of the set top box when the USB connector is connected to the set top box;
   a metal plate in direct contact with the one or more magnets; and
   a thermal pad in direct contact with and positioned between the processor and the metal plate.

2. The co-processor module of claim 1, wherein the metal plate is a first metal plate and the thermal pad is a first thermal pad, and further comprising a second thermal pad positioned against the PCB and a second metal plate positioned against the second thermal pad.

3. The co-processor module of claim 1, wherein the enclosure comprises a first half and a second half, and wherein the one or more magnets and the USB connector extend through the first half of the enclosure.

4. The co-processor module of claim 3, wherein the first half includes a planar region surrounding each of the one or more magnets and offset from the first half, each planar region being approximately co-planar with an outward facing surface of the corresponding magnet.

5. The co-processor module of claim 3, wherein the metal plate is attached to the first half, wherein the one or more magnets are captured therebetween.

6. A co-processor module for use with a device, the module comprising:
   an enclosure having a first half and a second half;
   a processor assembly contained in the enclosure and including a PCB, a processor, and a connector extending through the first half;
   one or more magnets extending through the first half and positioned to directly contact a surface of the device when the connector is connected to the device;
   a metal plate attached to the first half, wherein the one or more magnets are in direct contact with and captured between the first half and the metal plate; and
   a thermal pad in direct contact with and positioned between the processor and the metal plate.

7. The co-processor module of claim 6, wherein the metal plate is a first metal plate and the thermal pad is a first thermal pad, and further comprising a second thermal pad positioned against the PCB and a second metal plate positioned against the second thermal pad.

8. The co-processor module of claim 7, wherein the second metal plate is attached to the second half.

9. The co-processor module of claim 6, wherein the first and second halves include mating features configured for snap together engagement with each other.

10. The co-processor module of claim 6, wherein the first half includes a planar region surrounding each of the one or more magnets and offset from the first half, each planar region being approximately co-planar with an outward facing surface of the corresponding magnet.

11. The co-processor module of claim 6, wherein the connector is a USB connector.

12. A method for supplementing the processing capability of an electronic device, the method comprising:
   connecting a module containing a processing device to the electronic device via a connector;
   retaining the module against a surface of the electronic device with one or more magnets in direct contact with the surface; and
   transferring heat from the processing device to the surface of the electronic device via a metal plate in direct contact with the one or more magnets.

13. The method of claim 12, wherein the processing device if one of a processor or a memory device.

14. The method of claim 12, wherein the electronic device is a set top box.

15. The method of claim 12, wherein the connector is a USB connector.

* * * * *